United States Patent
Chen

(10) Patent No.: US 8,591,064 B2
(45) Date of Patent: Nov. 26, 2013

(54) LIGHT EMITTING DIODE STREET LAMP HAVING A NOVEL HEAT DISSIPATION STRUCTURE

(75) Inventor: Jeong-Shiun Chen, Jiangxi (CN)

(73) Assignee: Jingdezhen Fared Technology Co., Ltd., Jingdezhen Jiangxi (CN)

( * ) Notice: Subject to any disclaimer, the term of this patent is extended or adjusted under 35 U.S.C. 154(b) by 0 days.

(21) Appl. No.: 13/700,321

(22) PCT Filed: May 21, 2011

(86) PCT No.: PCT/CN2011/074474
§ 371 (c)(1),
(2), (4) Date: Nov. 27, 2012

(87) PCT Pub. No.: WO2011/147288
PCT Pub. Date: Dec. 1, 2011

(65) Prior Publication Data
US 2013/0077313 A1    Mar. 28, 2013

(30) Foreign Application Priority Data
May 28, 2010   (CN) .................. 2010 2 0206884 U

(51) Int. Cl.
*H01L 33/56*   (2010.01)
(52) U.S. Cl.
USPC ............... 362/249.02; 362/249.01; 257/98; 257/99
(58) Field of Classification Search
CPC .... F21S 8/085; F21S 8/086; G02F 1/133603; G02F 1/1336
USPC .............. 362/249.01–249.02, 373, 555, 613
See application file for complete search history.

(56) References Cited

U.S. PATENT DOCUMENTS 7,766,661 B2 *   8/2010   Kuwahara et al. .............. 439/56

FOREIGN PATENT DOCUMENTS

| CN | 101333075 A | 12/2008 |
| CN | 101394052 A | 3/2009 |
| CN | 201203085 Y | 3/2009 |
| CN | 201207388 Y | 3/2009 |
| CN | 201336319 Y | 10/2009 |
| CN | 201354979 T | 12/2009 |
| CN | 201706335 U | 1/2011 |
| TW | M391036 | 10/2010 |

* cited by examiner

*Primary Examiner* — Tracie Y Green
(74) *Attorney, Agent, or Firm* — Muncy, Geissler, Olds & Lowe, PLLC

(57) ABSTRACT

A light emitting diode (LED) street lamp includes an LED chip, a ceramic substrate, a lamp shade, a nano-enamel layer and a thermally radiative heat dissipation film. The nano-enamel layer is disposed on the ceramic substrate to provide electrical insulation and isolation for protection, is made from nano-particles to have a surface with the function of self-cleaning due to lotus effect. The thermally radiative heat dissipation film is disposed on the inner surface of the lamp shade and the surface of the ceramic substrate, and has a surface microscopic crystalline structure. The thermally radiative heat dissipation film fastly propagates the heat generated by the LED chip by thermal radiation in some specific direction so as to improve the efficiency of heat dissipation, reduce the total thickness, enhance the efficiency of light emitting and effectively prolong the lifetime of the LED street lamp.

6 Claims, 1 Drawing Sheet

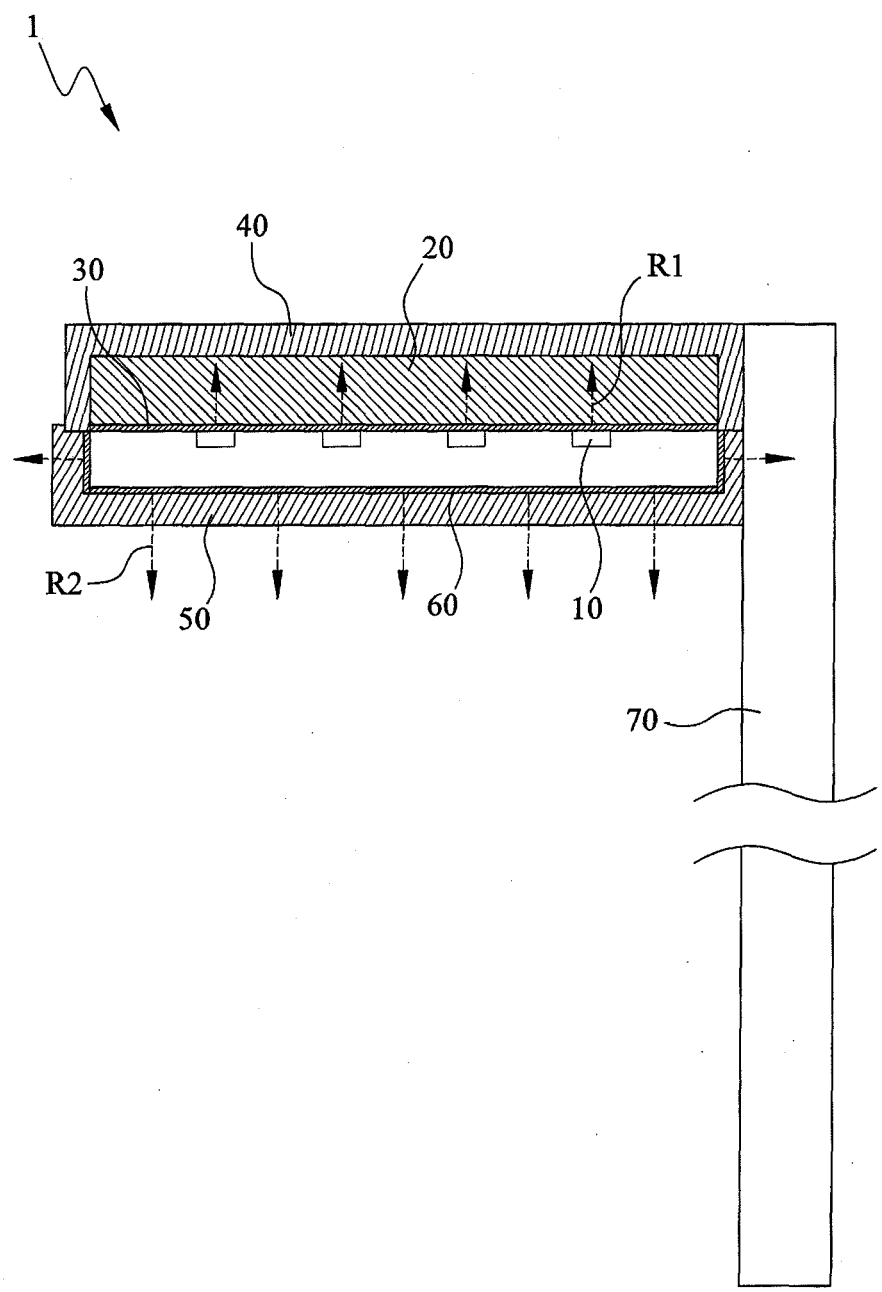

LIGHT EMITTING DIODE STREET LAMP HAVING A NOVEL HEAT DISSIPATION STRUCTURE

BACKGROUND OF THE INVENTION

1. Field of the Invention

The present invention generally relates to a light emitting diode (LED) street lamp, and more specifically to an LED street lamp having a nano-enamel layer and a thermally radiative heat dissipation film.

2. The Prior Arts

With the advanced progress in the technology of LED and the well developed peripheral control circuits, LED has become one of the most important light sources. In particular, LED does not contain mercury so as to meet the requirement of Rohs (Restriction of Hazardous Substances Directive) related to the Restriction of the use of certain hazardous substances in electrical and electronic equipment by European Union. Moreover, LED has been widely used in the mobile phone, the backlight module of LCD monitor and television, the projector and general lighting device because of high lumen, low power consumption, long lifetime and high color rendering index.

As for the application of LED, there are many shortcomings about the traditional LED lamp including a plurality of LEDs with low yield, weak connection, chromatic aberration and high maintenance cost. As the technology in the light guiding developed, the illumination device using the high light emitting LEDs has become more popular. However, the power of the high light emitting LED increases as the intensity desired increases, the working temperature of the LED may thus considerably increase. The efficiency of heat dissipation for traditional LED packages is usually low so as to cause lower light emitting and shorter lifetime of the LED lamp or other LED products due to thermal effect. Therefore, how to solve low heat dissipation is a key issue in the LED applications.

In the prior arts, an LED street lamp generally includes a lamp post, an aluminum extrusion casing, a substrate, LED bulbs and a lamp shade. The aluminum extrusion casing is manufactured from aluminum blocks or aluminum alloy blocks by the aluminum extruding process. The substrate is provided in the aluminum extrusion casing to receive the external power and signals. The LED bulbs are provided on the substrate. The lamp shade and the aluminum extrusion casing are jointed together to enclose the substrate and the LED bulbs. The lamp shade is usually made from glass or acrylic plastic to provide light transparency.

However, the surface of the aluminum extrusion casing is easily oxidized and a blocking film tends to form due to water or dust adhering to the surface such that the propagation of the heat is greatly influenced and the heat dissipation is deteriorated. Also, the light emitting and the lifetime are reduced. Additionally, the traditional street lamp is much heavier and expensive because the aluminum extrusion casing removes the heat generated by the LED bulbs by thermal conduction and it needs more aluminum alloy to form the aluminum extrusion casing with larger thickness such as 30 cm to enhance thermal conduction.

Therefore, it is desired to provide a new LED street lamp without the aluminum extrusion casing to overcome the above problems in the prior arts.

SUMMARY OF THE INVENTION

Therefore, the present invention has been made in view of the above problems, and it is an objective of the present invention to provide an LED street lamp, which includes a plurality of LED chips, a ceramic substrate, a first thermally radiative heat dissipation film, a nano-enamel layer, a lamp shade, a second thermally radiative heat dissipation film and a lamp post. The LED chips are formed on a plurality of sapphire substrates, respectively. The ceramic substrate with excellent thermal insulation has an upper surface and a lower surface.

The first thermally radiative heat dissipation film with a surface microscopic crystalline structure is disposed on the lower surface of the ceramic substrate and is made from a mixture of metal and nonmetal. The first thermally radiative heat dissipation film also has a contact surface connected to the ceramic substrate and a binding surface bound with the sapphire substrates by silver paste. The mixture of metal and nonmetal consists of a metal compound and a nonmetal compound. The metal compound consists of at least one of silver, copper, tin, aluminum, titanium, iron and antimony, or at least one alloy of silver, copper, tin, aluminum, titanium, iron and antimony, or at least one oxide or halide of silver, copper, tin, aluminum, titanium, iron and antimony. The nonmetal compound consists of at least one of oxide, nitride and inorganic acid of at least one of boron and carbon. For example, the mixture of metal and nonmetal consists of halide of titanium antimony and carbonate.

The nano-enamel layer is disposed on the ceramic substrate and is formed by sintering nano-particles to have a surface with the function of self-cleaning due to lotus effect caused by the surface properties of the nano-particles. Therefore, it is possible to present water and dust from adhering to the nano-enamel layer. Meanwhile, the nano-enamel layer provides electrical insulation and isolation for protection.

The lamp shade made from glass or acrylic plastic is disposed under the LED chips, and has light transparency. The lamp shade and the nano-enamel layer are connected together to enclose the LED chips, the ceramic substrate and the first thermally radiative heat dissipation film. The lamp shade has an inner surface and an outer surface, and the inner surface faces the LED chips. The second thermally radiative heat dissipation film with light transparency is disposed on the inner surface of the lamp shade and is made from the same material as the first thermally radiative heat dissipation film. The second thermally radiative heat dissipation film has a contact surface connected to the lamp shade and a free surface which has a second surface microscopic crystalline structure formed of the crystals. The lamp post is connected to the nano-enamel layer to provide support function.

Each of the first surface microscopic crystalline structure of the first thermally radiative heat dissipation film and the second surface microscopic crystalline structure of the second thermally radiative heat dissipation film consists of the crystals with a grain size of 2 nm to 1 µm. The crystals in the first and second surface microscopic crystalline structures are global crystals or polyhedral crystals, such as pyramid octahedral crystals. The thermally radiative heat dissipation film propagates the heat generated by the LED chip by thermal radiation in some specific direction so as to improve the efficiency of heat dissipation, and in particular, reduce the total thickness, enhance the efficiency of light emitting and effectively prolong the lifetime of the LED street lamp.

The above lotus effect caused by the surface properties of the nano-enamel layer of the present invention can prevent the dust and water from adhering so as to implement the self-cleaning function. Thus, the problems of blocking due to the dust or water adhering in the prior arts are resolved. The property of the thermally radiative heat dissipation film propagating the heat generated by the LED chips by thermal radiation in some specific direction can speed up heat dissipation and improve the efficiency of light emitting as well as prolong the lifetime of the LED chip and the whole LED street lamp. Additionally, the nano-enamel layer is used to replace traditional aluminum heat sinks such that the weight, thickness and cost are dramatically reduced.

BRIEF DESCRIPTION OF THE DRAWINGS

The present invention can be understood in more detail by reading the subsequent detailed description in conjunction with the examples and references made to the accompanying drawings, wherein:

FIG. 1 is a schematic view showing an LED street lamp according to one embodiment of the present invention.

DETAILED DESCRIPTION OF THE PREFERRED EMBODIMENT

The present invention may be embodied in various forms and the details of the preferred embodiments of the present invention will be described in the subsequent content with reference to the accompanying drawings. The drawings (not to scale) show and depict only the preferred embodiments of the invention and shall not be considered as limitations to the scope of the present invention. Modifications of the shape of the present invention shall too be considered to be within the spirit of the present invention.

FIG. 1 clearly illustrates the LED street lamp according to one embodiment of the present invention. As shown in FIG. 1, the LED street lamp 1 of the present invention includes a plurality of LED chips 10, a ceramic substrate 20, a first thermally radiative heat dissipation film 30, a nano-enamel layer 40, a lamp shade 50, a second thermally radiative heat dissipation film 60 and a lamp post 70. The LED chips 10 are disposed on a plurality of sapphire substrates (not shown), respectively. The ceramic substrate 20 with excellent thermal insulation has an upper surface and a lower surface.

The first thermally radiative heat dissipation film 30 is made from the mixture of metal and nonmetal, and is disposed on the lower surface of the ceramic substrate 20. The first thermally radiative heat dissipation film 30 has a contact surface and a binding surface. The contact surface is connected to the ceramic substrate 10 and the binding surface is connected to the sapphire substrate by silver paste. The binding surface of the first thermally radiative heat dissipation film 30 has a surface microscopic crystalline structure with crystal. The mixture of metal and nonmetal consists of a metal compound and a nonmetal compound. More specifically, the metal compound consists of at least one of silver, copper, tin, aluminum, titanium, iron and antimony, or at least one alloy of silver, copper, tin, aluminum, titanium, iron and antimony, or at least one oxide or halide of silver, copper, tin, aluminum, titanium, iron and antimony. The nonmetal compound consists of at least one of oxide, nitride and inorganic acid of at least one of boron and carbon. For example, the mixture of metal and nonmetal consists of halide of titanium antimony and carbonate.

Additionally, the nano-enamel layer 40 is disposed on the ceramic substrate and is formed by sintering nano-particles consisting of one of aluminum oxide, aluminum nitride, zirconium oxide and calcium fluoride. Therefore, it is possible to prevent water and dust from adhering to the nano-enamel layer because the surface of the nano-enamel layer 40 has the function of self-cleaning due to lotus effect caused by the surface properties of the nano-particles. Meanwhile, the nano-enamel layer 40 further provides electrical insulation and isolation for protection.

The lamp shade 50 is disposed under the LED chips 10 and is made from glass or acrylic plastic to have light transparency. The lamp shade 50 and the nano-enamel layer 40 are connected together to enclose the LED chips 10, the ceramic substrate 20 and the first thermally radiative heat dissipation film 30. The lamp shade 50 has an inner surface and an outer surface. The inner surface of the lamp shade 50 faces the LED chips 10. The second thermally radiative heat dissipation film 60 with light transparency is disposed on the inner surface of the lamp shade. The second thermally radiative heat dissipation film 60 is made from the same material as the first thermally radiative heat dissipation film 30. The second thermally radiative heat dissipation film 60 has a contact surface connected to the lamp shade 60 and a free surface, which has a second surface microscopic crystalline structure consisting of the crystals. The lamp post 70 is connected to the nano-enamel layer 40 to provide support function.

Each of the first surface microscopic crystalline structure of the first thermally radiative heat dissipation film 30 and the second surface microscopic crystalline structure of the second thermally radiative heat dissipation film 60 consists of the crystals with a grain size of 2 nm to 1 μm. More specifically, the crystals in the first and second surface microscopic crystalline structures are global crystals or polyhedral crystals, such as pyramid octahedral crystals. The first thermally radiative heat dissipation film 30 propagates the heat by first thermal radiation R1 towards the contact surface of the first thermally radiative heat dissipation film 30. Similarly, the second thermally radiative heat dissipation film 60 propagates the heat by second thermal radiation R2 towards the contact surface of the second thermally radiative heat dissipation film 60. That is, the heat dissipation flow of thermal radiation is directed in some specific direction so as to improve the efficiency of heat dissipation.

One aspect of the present invention is that the surface properties of the nano-enamel layer provided lotus effect to prevent water and dust from adhering to the surface of the nano-enamel layer so as to achieve self-cleaning and overcome the problem about the blocking layer, which is formed due to water and dust.

Another aspect of the present invention is that the thermally radiative heat dissipation films formed on the lamp shade and the ceramic substrate, respectively, provide directive thermal radiation to speed up the propagation of the heat generated by the LED chips. Thus, the efficiency of light emitting is improved and the lifetime of the LED chips and the whole LED street lamp is prolonged. Moreover, the total thickness of the LED street lamp is reduced to 3 to 10 cm by using the nano-enamel layer to replace the traditional aluminum extrusion casing. Meanwhile, the weight and manufacturing cost are dramatically reduced.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A light emitting diode (LED) street lamp, comprising:
a plurality of LED chips formed on a plurality of sapphire substrates, respectively;
a ceramic substrate having an upper surface and a lower surface;
a first thermally radiative heat dissipation film disposed on the lower surface of the ceramic substrate and made from a mixture of metal and nonmetal, wherein the first thermally radiative heat dissipation film has a first surface microscopic crystalline structure, which is formed of a plurality of crystals, and the first thermally radiative heat dissipation film has a contact surface connected to the ceramic substrate and a binding surface bound with the sapphire substrates by silver paste;
a nano-enamel layer formed on the ceramic substrate;
a lamp shade with light transparency disposed under the LED chips, wherein the lamp shade and the nano-enamel layer are connected together to enclose the LED chips, the ceramic substrate and the first thermally radiative heat dissipation film, the nano-enamel layer has an inner surface and an outer surface, and the inner surface faces the LED chips;
a second thermally radiative heat dissipation film with light transparency disposed on the inner surface of the lamp shade and made from the mixture of metal and nonmetal, wherein the second thermally radiative heat dissipation film has a contact surface connected to the lamp shade and a free surface, which has a second surface microscopic crystalline structure formed of the crystals; and
a lamp post connected to the nano-enamel layer to provide support function.

2. The LED street lamp as claimed in claim 1, wherein the first surface microscopic crystalline structure propagates heat generated by the LED chips from the binding surface of the first thermally radiative heat dissipation film towards the contact surface of the first thermally radiative heat dissipation film by thermal radiation, and the second surface microscopic crystalline structure propagates the heat generated by the LED chips from the free surface of the second thermally radiative heat dissipation film towards the contact surface of the second thermally radiative heat dissipation film by thermal radiation.

3. The LED street lamp as claimed in claim 1, wherein the nano-enamel layer is formed by sintering nano-particles, and the nano-particles consists of one of aluminum oxide, aluminum nitride, zirconium oxide and calcium fluoride.

4. The LED street lamp as claimed in claim 1, wherein the mixture of metal and nonmetal consists of a metal compound and a nonmetal composition, the metal compound consist of at least one of silver, copper, tin, aluminum, titanium, iron and antimony, or at least one alloy of silver, copper, tin, aluminum, titanium, iron and antimony, or at least one oxide or halide of silver, copper, tin, aluminum, titanium, iron and antimony, and the nonmetal compound consists of at least one of oxide, nitride and inorganic acid of at least one of boron and carbon.

5. The LED street lamp as claimed in claim 1, wherein the crystal is global crystal or polyhedral crystal, and the crystal has a grain size of 2 nm to 1 μm.

6. The LED street lamp as claimed in claim 1, wherein the lamp shade is made from glass or acrylic plastic.

* * * * *